United States Patent [19]

Matsui et al.

[11] Patent Number: 4,501,480
[45] Date of Patent: Feb. 26, 1985

[54] SYSTEM FOR DEVELOPING A PHOTO-RESIST MATERIAL USED AS A RECORDING MEDIUM

[75] Inventors: Fumio Matsui; Mitsuaki Sashida, both of Tokorozawa, Japan

[73] Assignee: Pioneer Electronic Corporation, Tokyo, Japan

[21] Appl. No.: 434,478

[22] Filed: Oct. 15, 1982

[30] Foreign Application Priority Data

Oct. 16, 1981 [JP]  Japan ..................... 56-153669[U]

[51] Int. Cl.³ ............................................. G03D 5/04
[52] U.S. Cl. ...................... 354/298; 354/317; 354/325; 134/57 R; 134/113; 134/151; 250/571
[58] Field of Search ............... 354/298, 317, 324, 325; 430/30; 134/1, 18, 56 R, 57 R, 113, 140, 149, 151; 369/54, 109, 116, 125, 126; 250/571

[56]  References Cited

U.S. PATENT DOCUMENTS

| | | | |
|---|---|---|---|
| 3,388,652 | 6/1968 | Parrent | 354/298 |
| 3,663,724 | 5/1972 | Benton et al. | 134/113 |
| 3,702,277 | 11/1972 | Lerner | 134/57 R |
| 3,953,265 | 4/1976 | Hood | 430/30 |
| 3,995,959 | 12/1976 | Shaber | 354/298 |
| 4,119,989 | 10/1978 | Carvalko et al. | 354/298 |
| 4,128,325 | 12/1978 | Melander et al. | 354/298 |
| 4,136,940 | 1/1979 | Lin | 354/298 |
| 4,142,107 | 2/1979 | Hatzakis et al. | 430/30 |

Primary Examiner—A. A. Mathews
Attorney, Agent, or Firm—Fleit, Jacobson, Cohn & Price

[57] ABSTRACT

A system for developing a photo-resist material of an optical recording medium on which digital information is recorded in the form of a series of pits whose position and length represent the digital information. In order to precisely control the size of the pits formed during the developing process, a diffraction beam of the monitoring energy beam passing through the pits is received by a sensor means which monitors the intensity of the diffraction beam and which produces a signal for controlling the supply of developing solution on the recording medium. A partition means is provided for isolating the path of the monitoring energy beam so as to eliminate absorption, diffraction or scattering effects due to the particles of developing solution sprayed on the surface of the recording medium.

4 Claims, 5 Drawing Figures

SYSTEM FOR DEVELOPING A PHOTO-RESIST MATERIAL USED AS A RECORDING MEDIUM

BACKGROUND OF THE INVENTION

1. Field of the Invention

The present invention relates to a system for developing photo-resist material used as a recording medium of an optical recording means such as an optical recording disc.

2. Description of the Prior Art

In recent years, optical recording systems have become popularly used for recording various information such as video signals and digital audio signals.

In a video disc player system or a compact digital audio disc player system, a laser beam is focused on the surface of a rotating disc having an optical pattern such as a series of pits or projections which represents recorded information. A reflection beam from the optical pattern on the disc is received by a photoelectric transducer which produces an electric output of a playback signal corresponding to the recorded information.

A master disc of this system comprises a glass base whose surface is polished, and a layer of a photoresist material formed thereon.

At the time of recording a recording laser beam, which is modulated in accordance with a signal indicative of the information to be recorded, is focused on the photo-resist layer of the master disc which is rotated at a predetermined high speed and which simultaneously is slowly translated along a radial axis thereof. Thus, the information is recorded along a spiral track on the photo-resist layer. After passing through such an exposure process, the photo-resist material of the disc is treated in a developing process, where the exposed portions of the photo-resist material are removed by a developing solution to engrave a series of pits representing the recording information.

Using the thus produced master disc, playback discs are manufactured in large quantities in much the same manner as conventional analog records.

Since the size of the pits formed by the developing process (i.e., the depth and width of the pits) is a factor which directly affects the precision of the playback operation, pit information must be controlled to be within a predetermined range of tolerance.

In order to control the size of the pits, it is necessary to adjust the time of developing, that is, the time duration of chemical reaction on the exposed portions of the photo-resist material. The speed of the chemical reaction, however, is affected by various parameter such as the degree of exposure, the density and the temperature of the developing solution, and so on.

In the case of piror art developing systems, the advancement of the chemical reaction is not monitored, and hence there is a problem that the size of the pits tends to vary from one disc to another.

SUMMARY OF THE INVENTION

An object of the invention is therefore to eliminate the above described drawback of the prior art developing systems, and to provide a system for developing a photo-resist material in which the advancement of the chemical reaction is monitored by means of a monitoring energy bean so as to control the size of the pits within a predetermined allowable range.

Another object of the invention is to provide a system in which the intensity of the monitoring energy beam is precisely detected by eliminating fluctuations which might be caused by absorption, diffraction or scattering of the energy beam due to the spray of the developing solution or dust existing in the path of the monitoring energy beam.

According to the present invention, there is contemplated a system including a supply means for supplying a monitoring energy beam of a predetermined wavelength on a sensitive layer of the base being developed, at an angle of incidence greater or smaller than 90°, a detection means for detecting the intensity of a diffraction beam of a monitoring energy beam passing through the pits and producing a diffraction intensity signal, a partition means for isolating the path of the energy beam from the developing solution, and a control means for controlling the supply of the developing solution in accordance with the diffraction intensity signal.

The foregoing and other objects and advantages of the present invention will become more clearly understood upon review of the following description taken in conjunction with the accompanying drawings.

DETAILED DESCRIPTION OF PREFERRED EMBODIMENTS

Before entering into the explanation of the preferred embodiments, brief reference is made to U.S. patent application Ser. No. 396,073, filed July 7, 1982, under the title "Method and System for Developing a Photoresist Material used as a Recording Medium", assigned to the same assignee as the present invention, the teachings of which are hereby incorporated by reference. In this application, there is disclosed a system for developing a photo-resist material in which the developing process is monitored by a monitoring laser beam and a photo-sensitive means which detects a diffraction beam of the monitoring laser beam.

Figure 1:
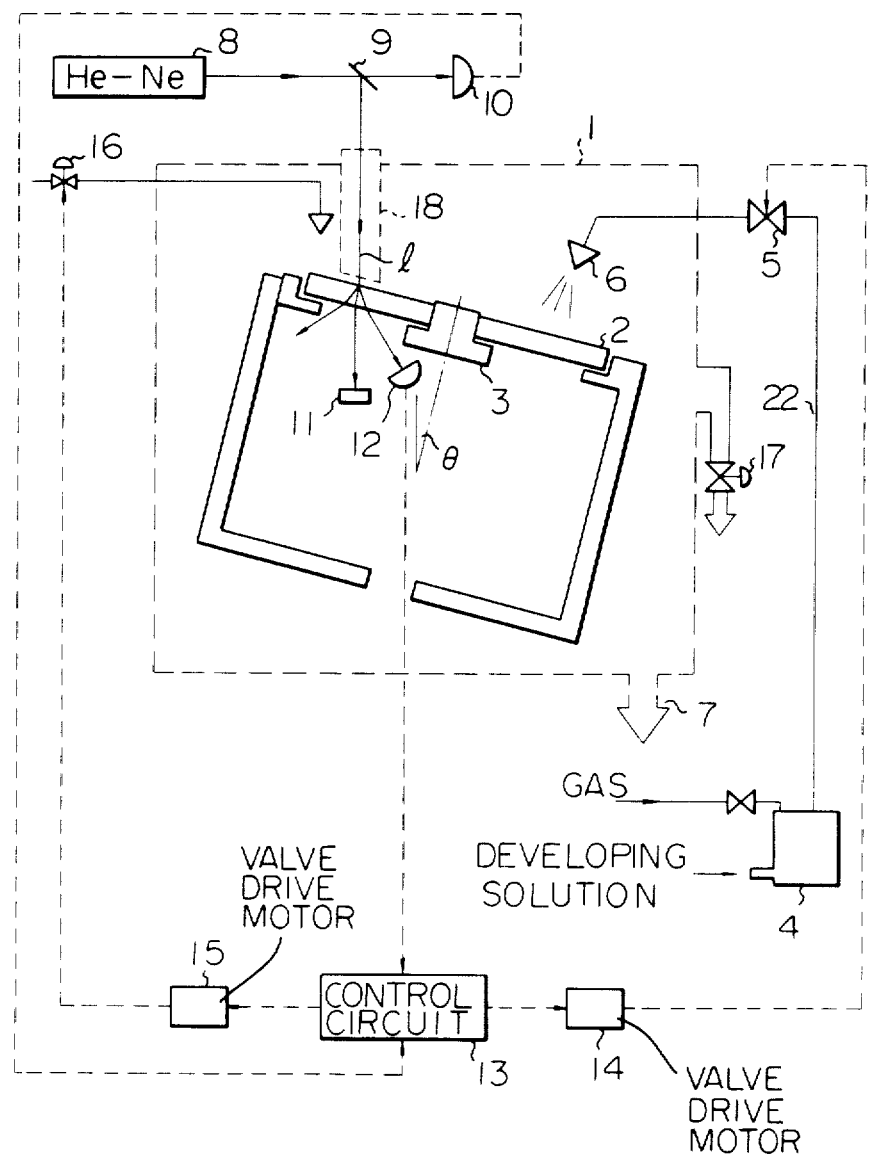
FIG. 1 is a schematic diagram of an embodiment of a developing system according to the present invention.

Referring now to FIG. 1, a first embodiment of the developing system according to the invention will be explained.

The developing system comprises a treatment chamber 1 housing a disc 2 which has passed through a laser cutting process, i.e., an exposure to a digitally modulated laser beam. The disc 2 is mounted on a turntable 3 which is slightly inclined to the direction of gravity by a predetermined angle, and which is driven at a predetermined constant rotational speed by means or an electric motor (not shown).

The disc 2 has a transparent base made of glass, for example, and a thin film layer of a photo-resist material (the thickness being equal to or less than 2000 Angstroms) formed thereon.

A developing solution is supplied from a developing solution supply means, and is mixed with a pressurized gas such as nitrogen gas in a tank 4. The developing solution pressurized by the nitrogen gas or the mixture thereof is supplied to a nozzle 6 via a conduit 22 and a valve 5, by which the developing solution is sprayed on the surface of the disc 2.

During the developing process, portions of the photo-resist layer on the disc which have been exposed to a spot of the modulated laser beam, are removed by the developing solution supplied from the nozzle 6 and are washed away to form a series of pits on the disc 2 which represents the digital information.

The mixture of the developing solution and gas remaining in the treatment chamber 1 is discharged through a valve 17 disposed on a side wall of the treatment chamber 1. The other part of the developing solution flows down to the bottom of treatment chamber 1, and exits through a discharge outlet 7.

A laser beam source 8, such as a helium-neon tube, is provided at a position outside the treatment chamber 1. A laser beam from the source 8 is directed to the disc 2 via a half mirror 9 so that the laser beam is applied on the disc 2 at an angle of incidence inclined to a direction perpendicular to the disc 2 by a predetermined degree. Laser beam source 8 is part of the means for supplying a monitoring energy beam.

The laser beam passing through the half mirror 9 is received by a first photoelectric transducer 10, such as a photodiode or a photoelectric tube, for the purpose of monitoring the laser beam. The output signal of the first photoelectric transducer 10 is applied to control circuit 13 which will be described hereinafter.

If pits are not present at the position of the photo-resist layer at which the laser beam is applied, the laser beam passes straight through the transparent base of the disc 2 and is received by a beam stop 11. The beam stop 11 absorbs almost all of the incident beam so as not to cause a disturbance to a photoelectric transducer 12 in the treatment chamber 1. On the other hand, if pits engraved by the developing solution are present at the position of the photo-resist layer at which the laser beam is applied, the laser beam is diffracted by the pits and is received by a second photoelectric transducer 12, or detection means similar to the first photoelectric transducer 10. The second photoelectric transducer 12 is disposed at a position away from the axis of the incident beam directed toward the transducer 11 so that a diffracted beam from the incident beam enters the photoelectric transducer.

An output signal of the photoelectric transducer 12, which is substantially proportional to the size of the pit being encountered by the laser beam, is applied to the control circuit 13. If the output signal of the second photoelectric transducer 12 reaches a predetermined reference level, the control circuit produces command signals for driving a valve drive motor 14 to close the valve 5, and for driving another valve drive motor 15 to open a valve 16 which controls a supply of pure water to the surface of the disc 2. Thus, since the photo-resist material on the surface of the disc 2 is no longer supplied with the developing solution, the development process is stopped.

Figure 2:
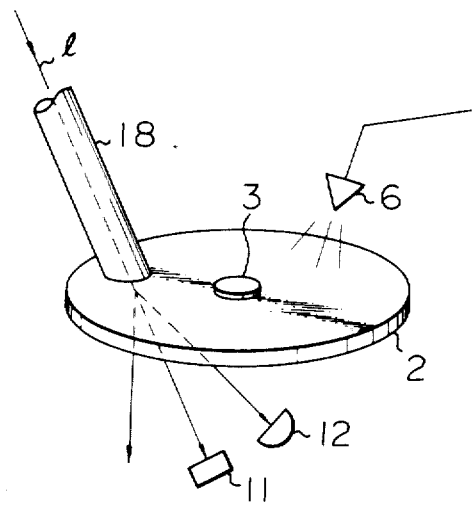
FIG. 2 is a perspective view of an example of a partition means used for isolating the path of the monitoring laser beam from the region in which the developing solution is sprayed.
Figure 5:
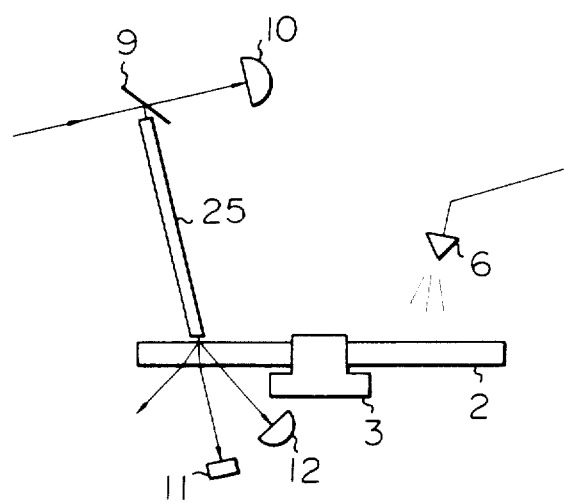
FIG. 5 is a third example of the partition means.

A partition cylinder 18 is provided in the treatment chamber 1, along the path 1 of the monitoring laser beam, so as to prevent particles such as the spray of the developing solution and dust from entering into the path 1. The partition cylinder 18 is preferably a cylindrical member having transparent lids at each end thereof. As illustrated in FIGS. 1, 2 and 5, a laser beam is transmitted through the ends of the cylinder, hence those ends are transparent to the laser beam.

As clearly shown in FIG. 2, the partition cylinder 18 has a configuration such that the cylinder covers the entire length of the path 1 of the laser beam in the treatment chamber 1. The intensity of the laser beam applied to the disc 2 thus is substantially free from absorption, diffraction or scattering effects of the particles in the treatment chamber 1, and is maintained constant.

Figure 3:
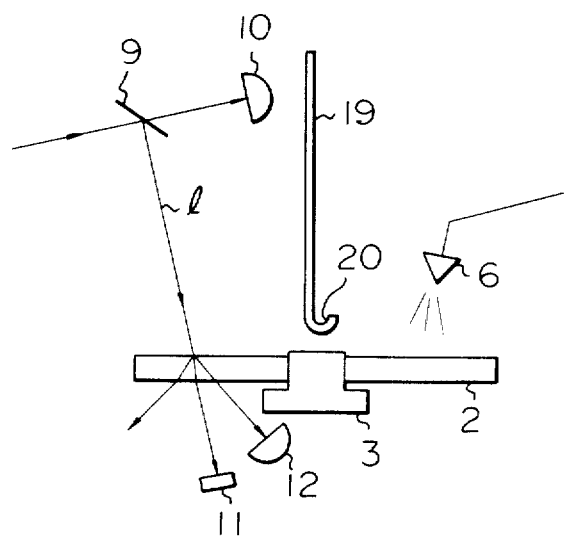
FIGS. 3 and 4 are, respectively, side and front view of another example of partition means which takes the form of a partition screen.
Figure 4:
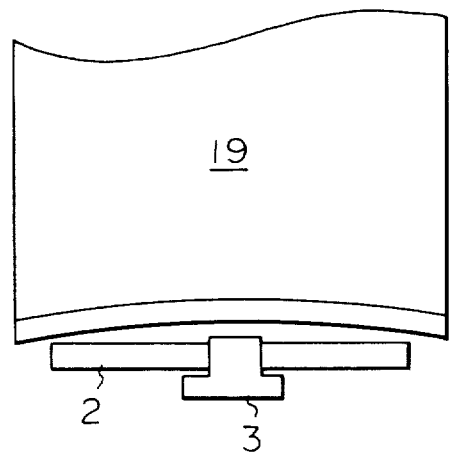

FIGS. 3 and 4 show another example of a partition means which takes the form of a partition screen 19.

The partition screen 19 has a dimension greater than the diameter of the disc 2, and is substantially vertically disposed above the turntable 3. The lower end of the partition screen 19 is provided with a bent portion 20 which forms a curved channel so as to drain the developing solution flowing into the channel from both ends of the channel.

FIG. 5 shows a third example of the partition means, which takes the form of an optical fiber element 25. Since the optical fiber element 25 leads the laser beam from the half mirror 9 to the surface of the disc 2, the disturbance due to particles in the treatment chamber 1 is eliminated, as is the case of the previous examples of partition means.

It will be appreciated from the foregoing that a precise control of the size of the pits formed during the developing process is enabled according to the present invention. It is to be noted that the intensity of the monitoring laser beam which is applied to the surface of the disc is maintained constant by using a partition means for isolating the path of the laser beam.

Above, preferred embodiments of the present invention have been described. It should be understood, however, that the foregoing description is for illustrative purposes only, and is not intended to limit the scope of the invention. Rather, there are numerous equivalents to the preferred embodiments, and such are intended to be covered by the appended claims.

What is claimed is:

1. A system for developing a photo-resist material of a sensitive layer formed on a substantially transparent base, the sensitive layer having been exposed to a recording energy beam modulated in accordance with information to be recorded, the system comprising:

means for supplying a developing solution on the sensitive layer in atomized form so as to remove the exposed portions of the photo-resist material to form a series of pits which represents the information to be recorded;

means for supplying a monitoring energy beam of a predetermined wavelength on the sensitive layer of the base being developed, at an angle of incidence greater or smaller than 90°;

detection means for detecting the intensity of a diffraction beam of said monitoring energy beam passing through the pits, and producing a diffraction intensity signal proportional thereto;

control means for controlling the supply of the developing solution in accordance with said diffraction intensity signal;

a drive means for rotating said base during the developing process; and a cylindrical member for isolating a path of said monitoring energy beam from said developing solution disposed around said path of said monitoring energy beam for the entire length of said path, an end of said cylindrical member being open and facing said sensitive layer whereby preventing the atomized developing solution from adhering to said end.

2. A system for developing a photo-resist material of a sensitive layer formed on a substantially transparent base, the sensitive layer having been exposed to a recording energy beam modulated in accordance with information to be recorded, the system comprising:
- means for supplying a developing solution on the sensitive layer so as to remove the exposed portions of the photo-resist material to form a series of pits which represent the information to be recorded;
- means for supplying a monitoring energy beam of a predetermined wavelength of the sensitive layer of the base being developed, at an angle of incidence greater or smaller than 90°;
- detection means for detecting the intensity of a diffraction beam of said monitoring energy beam passing through the pits, and producing a diffraction intensity signal proportional thereto;
- control means for controlling the supply of the developing solution in accordance with said diffraction intensity signal; and
- partition means for isolating a path of said monitoring energy beam from said developing solution, said partition means having a plate member disposed between said path of the monitoring energy beam and said developing solution supply means.

3. A system as recited in claim 2, wherein said plate member is provided with a channel portion at the lower periphery thereof for draining the developing solution collected by said plate member.

4. A system for developing a photo-resist material of a sensitive layer formed on a substantially transparent base, the sensitive layer having been exposed to a recording energy beam modulated in accordance with information to be recorded, the system comprising:
- means for supplying a developing solution on the sensitive layer in atomized form so as to remove the exposed portions of the photo-resist material to form a series of pits which represents the information to be recorded;
- means for supplying a monitoring energy beam of a predetermined wavelength on the sensitive layer of the base being developed, at an angle of incidence greater or smaller than 90°;
- detection means for detecting the intensity of a diffraction beam of said monitoring energy beam passing through the pits, and producing a diffraction intensity signal proportional thereto;
- control means for controlling the supply of the developing solution in accordance with said diffraction intensity signal; and
- a cylindrical member for isolating a path of said monitoring energy beam from said developing solution disposed around said path of said monitoring energy beam substantially throughout the entire length of said path, an end of said cylindrical nmember being open, being transparent to said monitoring energy beam and facing said sensitive layer.

* * * * *